(12) United States Patent
Baker

(10) Patent No.: US 8,149,646 B2
(45) Date of Patent: *Apr. 3, 2012

(54) DIGITAL FILTERS FOR SEMICONDUCTOR DEVICES

(75) Inventor: R. Jacob Baker, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 12/829,251

(22) Filed: Jul. 1, 2010

(65) Prior Publication Data

US 2010/0271899 A1 Oct. 28, 2010

Related U.S. Application Data

(63) Continuation of application No. 11/820,007, filed on Jun. 15, 2007, now Pat. No. 7,768,868.

(51) Int. Cl.
*G11C 8/00* (2006.01)
(52) U.S. Cl. .................. 365/236; 365/189.2; 365/189.15
(58) Field of Classification Search .................. 365/236, 365/189.2, 189.15
See application file for complete search history.

(56) References Cited

U.S. PATENT DOCUMENTS 5,680,336 A * 10/1997 Kaiser ........................... 708/276
7,196,967 B2 * 3/2007 Yada et al. .................. 365/233.1

* cited by examiner

*Primary Examiner* — Son Dinh
(74) *Attorney, Agent, or Firm* — Fletcher Yoder

(57) ABSTRACT

A memory device that, in certain embodiments, includes a memory element and a digital filter. The digital filter may include a counter and a divider, where the divider is configured to divide a count from the counter by a divisor.

20 Claims, 16 Drawing Sheets

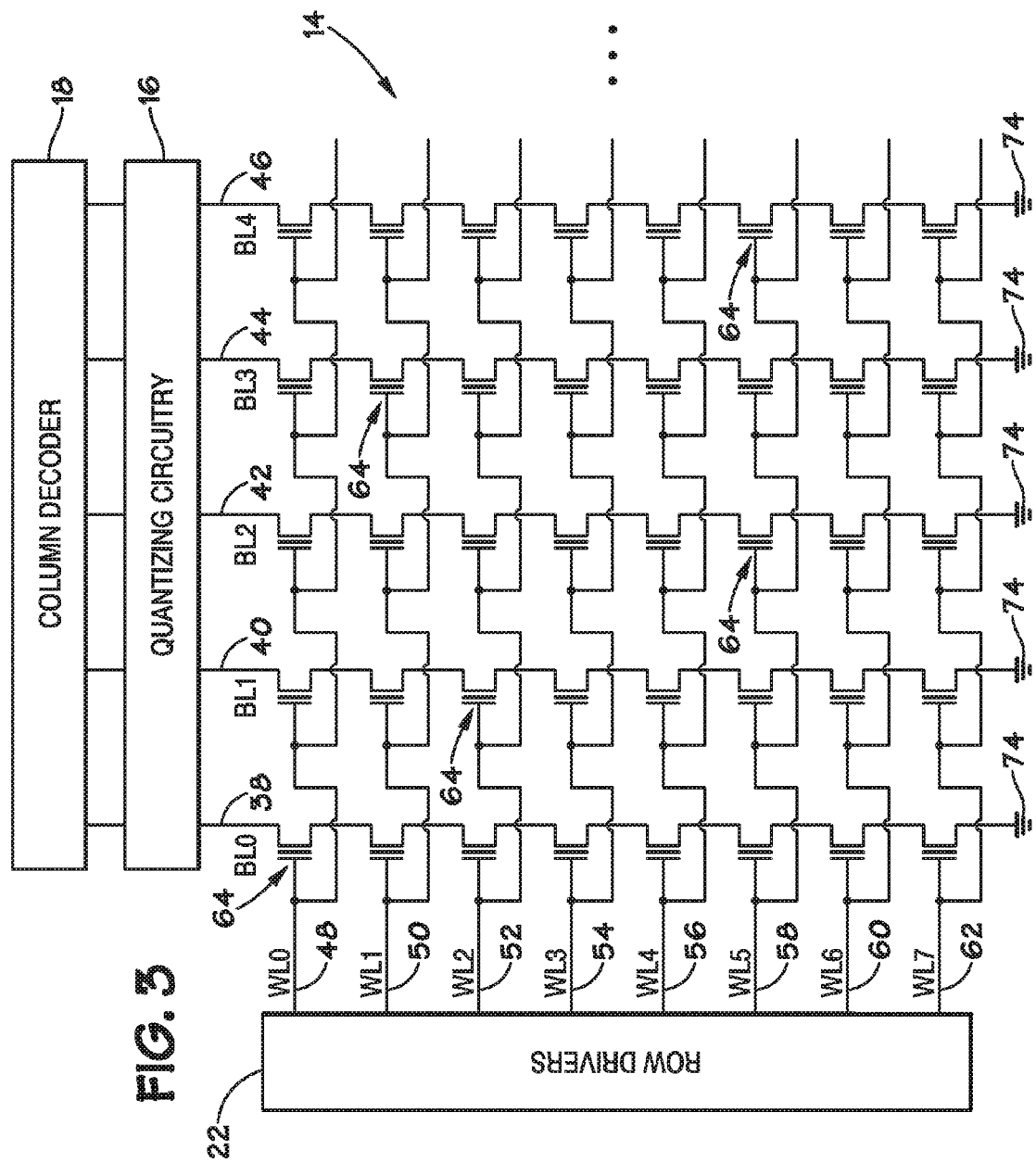

FIG. 14
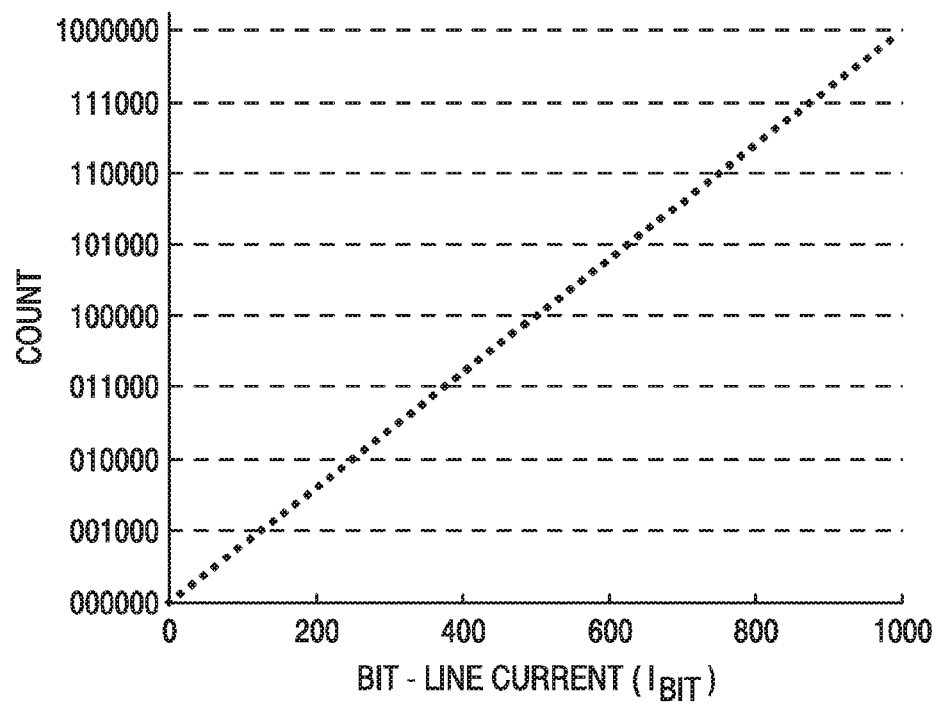
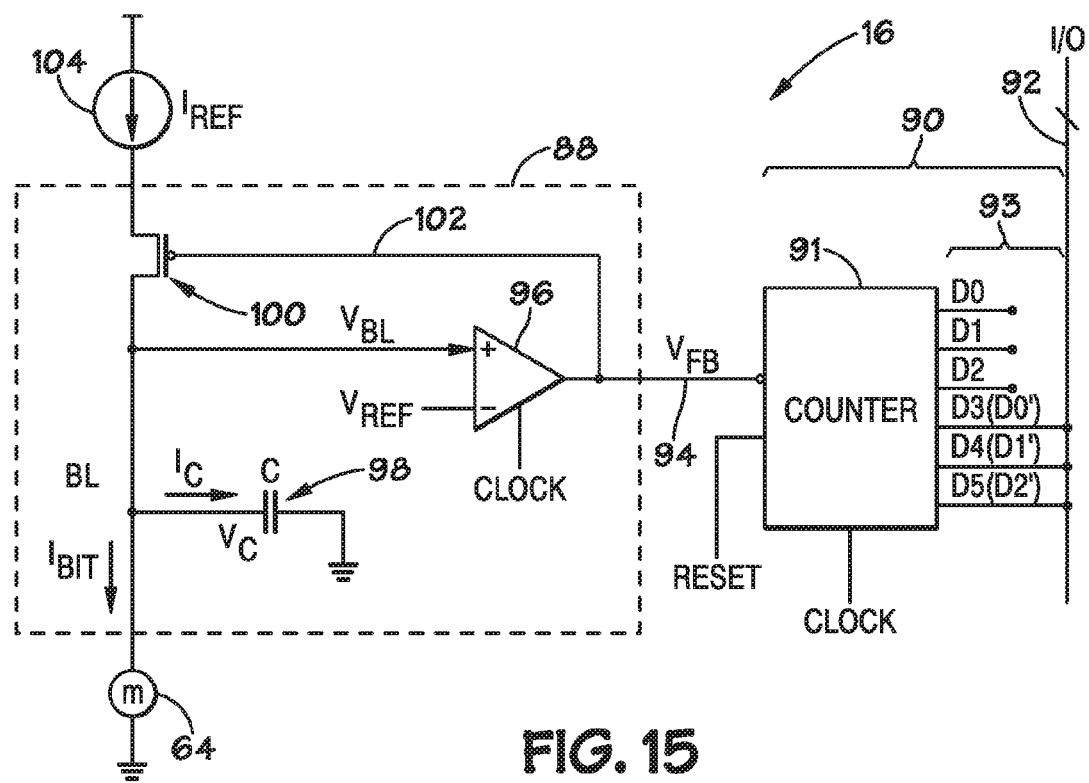
FIG. 15

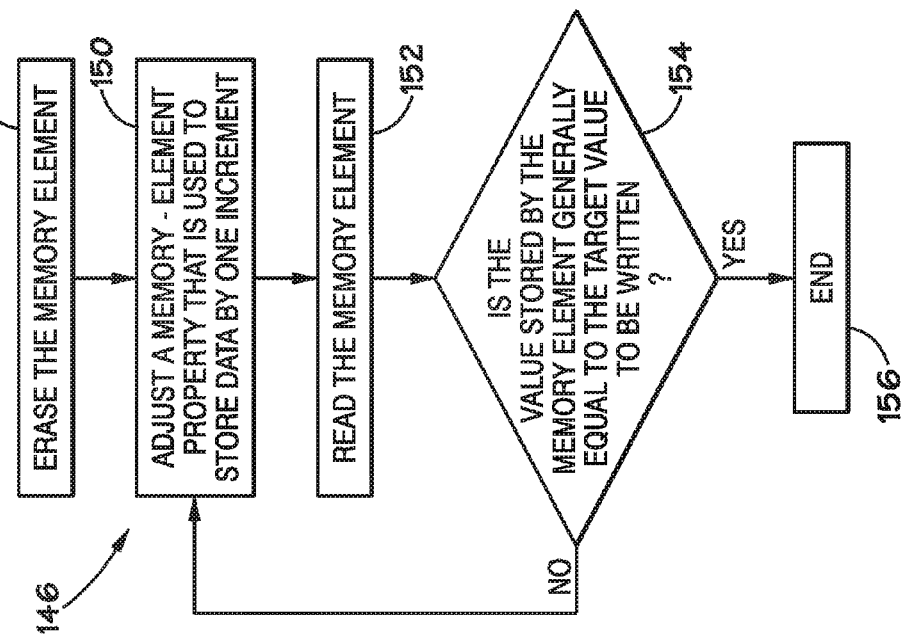
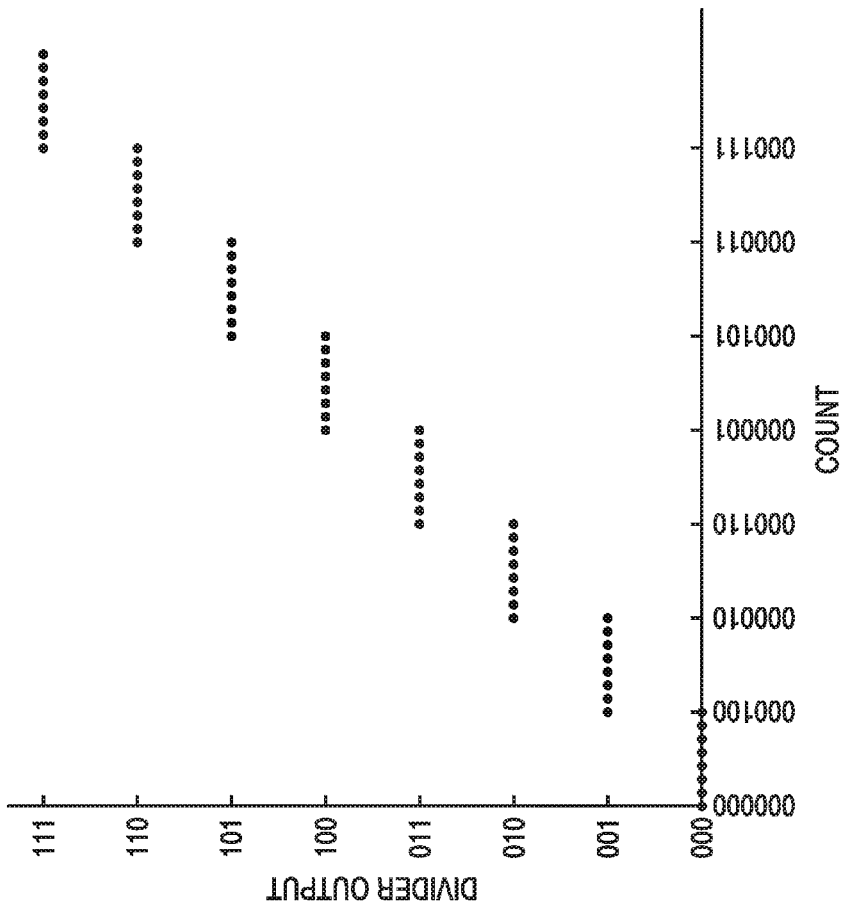

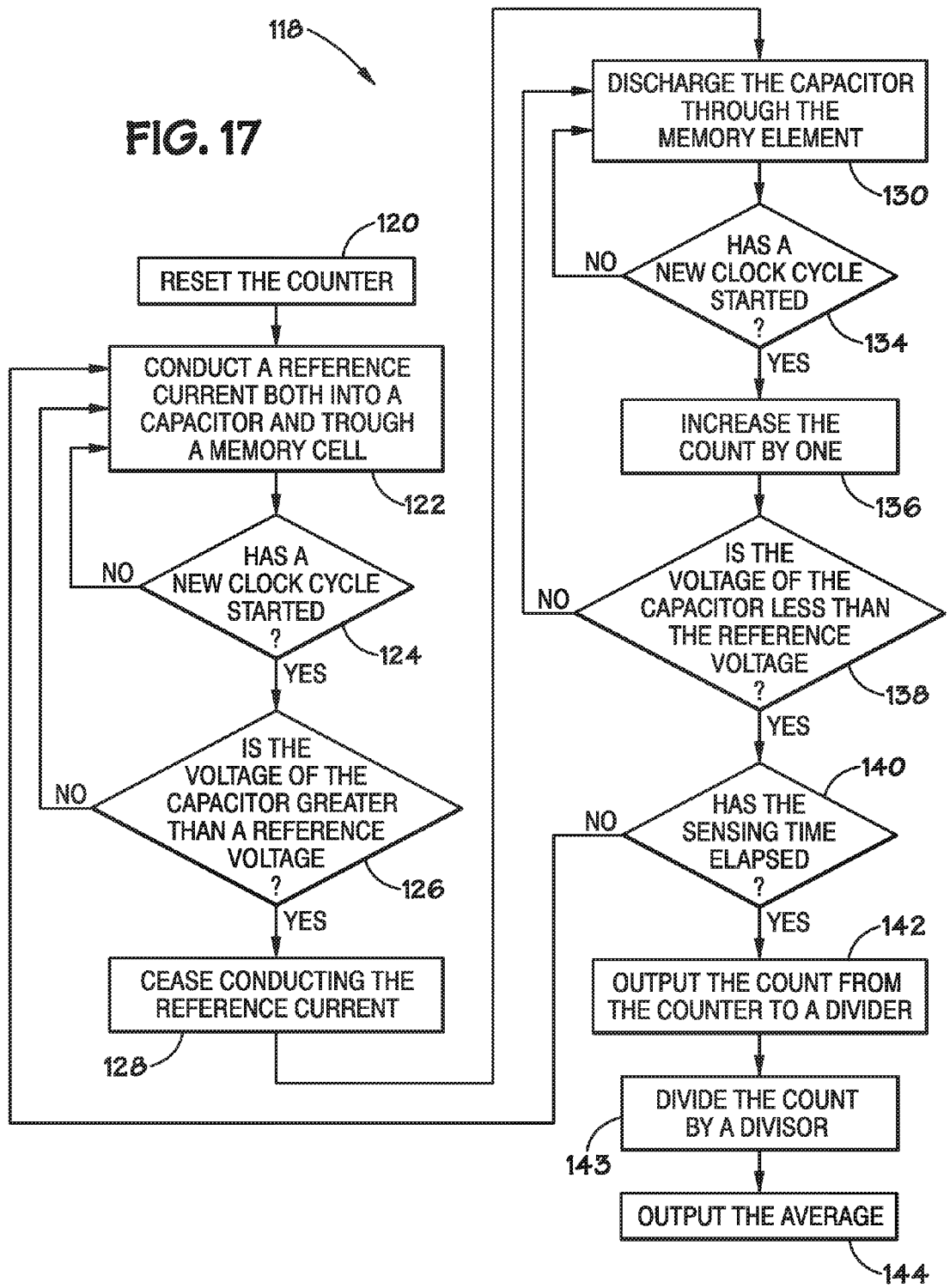

DIGITAL FILTERS FOR SEMICONDUCTOR DEVICES

CROSS-REFERENCE TO RELATED APPLICATIONS

This application is a continuation of and claims priority to U.S. patent application Ser. No. 11/820,007, filed on Jun. 15, 2007.

BACKGROUND

1. Field of the Invention

Embodiments of the present invention relate generally to digital filters, and, more specifically, to digital filters for sensing multi-bit memory elements or multi-level image sensors.

2. Description of the Related Art

Generally, memory devices include an array of memory elements and associated sense amplifiers. The memory elements store data, and the sense amplifiers read the data from the memory elements. To read data, for example, a current is passed through the memory element, and the current or a resulting voltage is measured by the sense amplifier. Conventionally, the sense amplifier measures the current or voltage by comparing it to a reference current or voltage. Depending on whether the current or voltage is greater than the reference, the sense amplifier outputs a value of one or zero. That is, the sense amplifier quantizes or digitizes the analog signal from the memory element into one of two logic states.

Many types of memory elements are capable of assuming more than just two states. That is, some memory elements are capable of multi-bit storage. For instance, rather than outputting either a high or low voltage, the memory element may output four or eight different voltage levels, each level corresponding to a different data value. However, conventional sense amplifiers often fail to distinguish accurately between the additional levels because the difference between the levels (e.g., a voltage difference) in a multi-bit memory element is often smaller than the difference between the levels in a single-bit memory element. Thus, conventional sense amplifiers often can not read multi-bit memory elements.

A variety of factors may tend to prevent the sense amplifier from discerning small differences in the levels of a multi-bit memory element. For instance, noise in the power supply, ground, and reference voltage may cause an inaccurate reading of the memory element. The noise may have a variety of sources, such as temperature variations, parasitic signals, data dependent effects, and manufacturing process variations. This susceptibility to noise often leads a designer to reduce the number of readable states of the memory element, which tends to reduce memory density and increase the cost of memory.

Conventional sense amplifiers present similar problems in imaging devices. In these devices, an array of light sensors output a current or voltage in response to light impinging upon the sensor. The magnitude of the current or voltage typically depends upon the intensity of the light. Thus, the capacity of the sense amplifier to convert accurately the current or voltage into a digital signal may determine, in part, the fidelity of the captured image. Consequently, noise affecting the sense amplifier may diminish the performance of imaging devices.

BRIEF DESCRIPTION OF THE DRAWINGS

FIG. 3 illustrates a memory array in accordance with an embodiment of the present invention;

FIG. 14 is a graph of bit-line current versus counter output for the quantizing circuit of FIG. 8;

FIG. 15 illustrates an example of a divider for a digital filter in accordance with an embodiment of the present invention;

FIG. 16 is a graph of count versus digital filter output for the quantizing circuit of FIG. 15.

FIG. 17 is flow chart of a read operation in accordance with an embodiment of the present invention;

FIG. 18 is flow chart of a write operation in accordance with an embodiment of the present invention.

DETAILED DESCRIPTION OF SPECIFIC EMBODIMENTS

Various embodiments of the present invention are described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming but would nevertheless be a routine undertaking of design, fabrication, and manufacture for those of ordinary skill having the benefit of this disclosure.

Some of the subsequently described embodiments may address one or more of the problems with conventional sense amplifiers discussed above. Some embodiments include a quantizing circuit configured to detect small differences in voltages and/or current by quantizing the signal and then digitally filtering noise from the quantized signal. As described below, in certain embodiments, an analog-to-digital converter outputs a pulse-outputs a pulse-density modulated bit-stream that represents the analog signal, and a digital filter integrates the bit-stream in a first filtration step. In some embodiments, the digital filter then performs a second filtration step whereby an average value is calculated from the integral of the bit-stream. Consequently, in some embodiments, the quantizing circuit may resolve small differences between voltage or current levels in multi-bit memory elements and/or light sensors, which may allow circuit designers to increase the number of bits stored per memory element and/or the sensitivity of an imaging device.

The following description begins with an overview of examples of systems that employ these quantizing circuits and the problems within these systems that may be addressed by these quantizing circuits. Then, a specific example of a quantizing circuit is described. Finally, additional examples of quantizing circuits are described.

Figure 1:
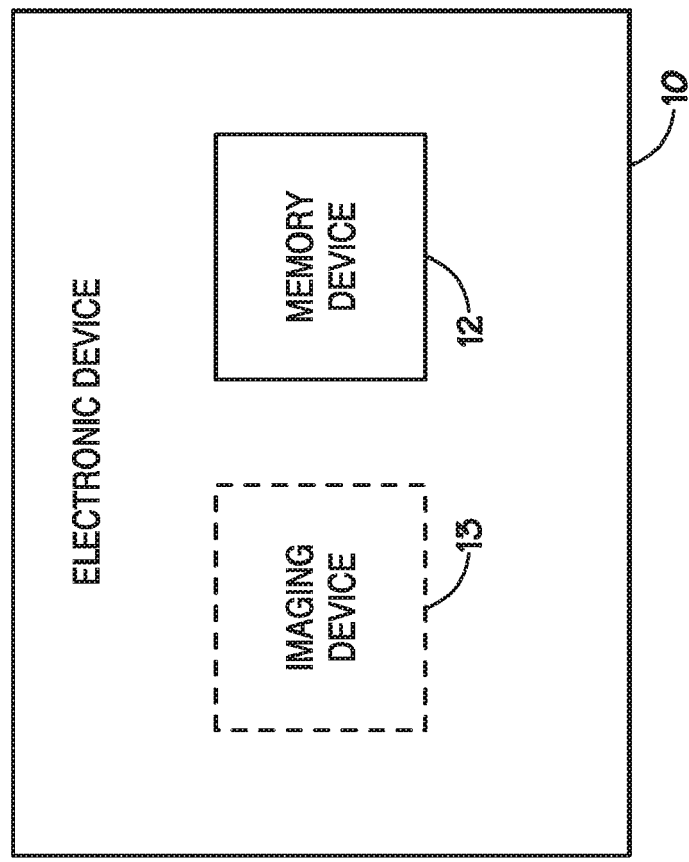
FIG. 1 illustrates an electronic device in accordance with an embodiment of the present invention.

FIG. 1 depicts an electronic device 10 in accordance with one or more of the present techniques. The illustrated electronic device 10 includes a memory device 12 that, as explained further below, may include multi-bit memory elements and quantizing circuits. Alternatively, or additionally, the electronic device 10 may include an imaging device 13 having the quantizing circuits.

Myriad devices may embody one or more of the present techniques. For example, the electronic device 10 may be a storage device, a communications device, an entertainment device, an imaging system, or a computer system, such as a personal computer, a server, a mainframe, a tablet computer, a palm-top computer, or a laptop.

Figure 2:
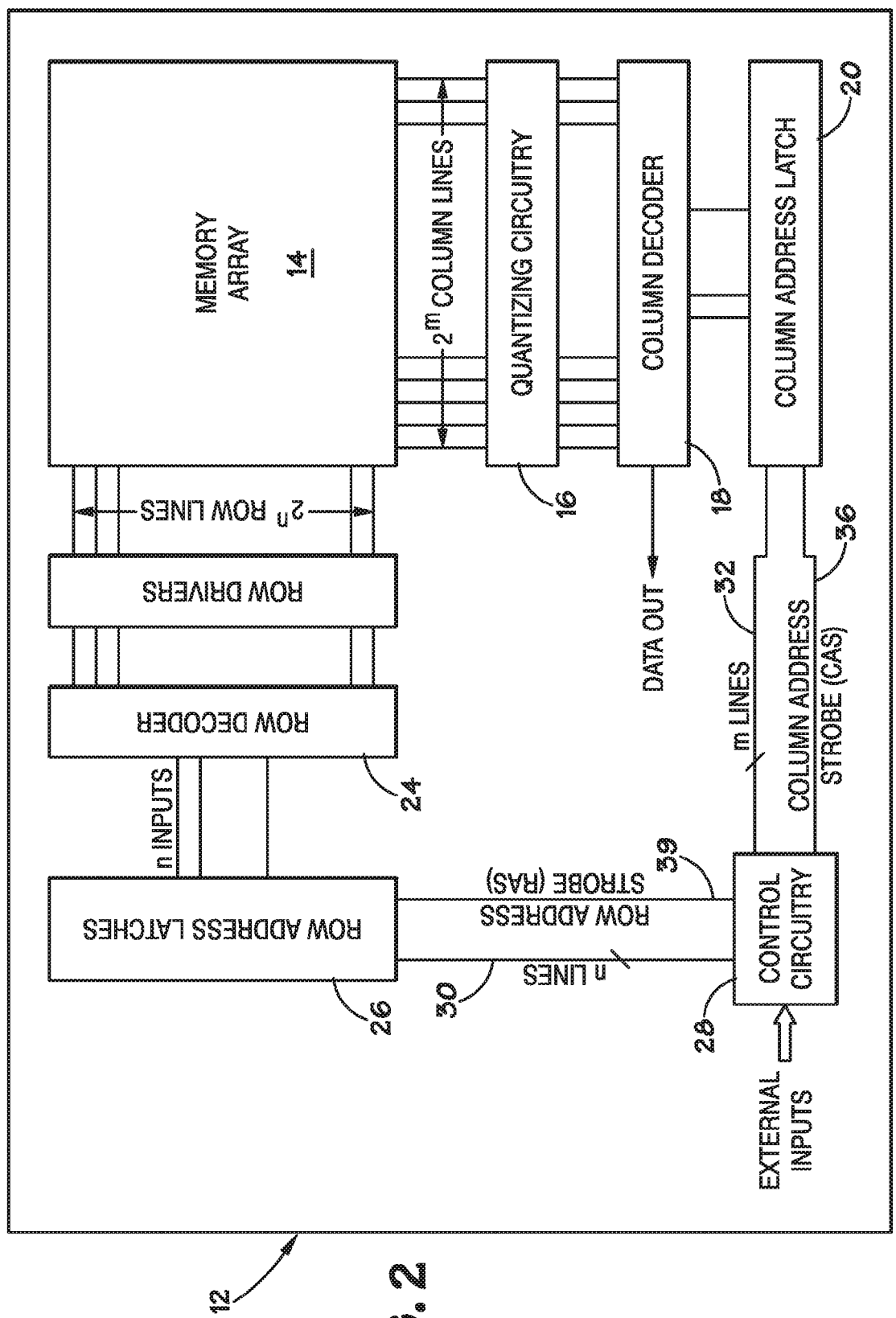
FIG. 2 illustrates a memory device in accordance with an embodiment of the present invention.

FIG. 2 depicts a block diagram of an embodiment of the memory device 12. The illustrated memory device 12 may include a memory array 14, a quantizing circuit 16, a column decoder 18, a column address latch 20, row drivers 22, a row decoder 24, row address latches 26, and control circuitry 28. As described below in reference to FIG. 3, the memory array 14 may include a matrix of memory elements arrayed in rows and columns. The imaging device 13 may include similar features except that in the case of the imaging device 13 (FIG. 1), the memory array 14 will include a matrix of imaging elements.

When accessing the memory elements, the control circuitry may receive a command to read from or write to a target memory address. The control circuitry 28 may then convert the target address into a row address and a column address. In the illustrated embodiment, the row address bus 30 transmits the row address to the row address latches 26, and a column address bus 32 transmits column address to the column address latches 20. After an appropriate settling time, a row address strobe (RAS) signal 34 (or other controlling clock signal) may be asserted by the control circuitry 28, and the row address latches 26 may latch the transmitted row address. Similarly, the control circuitry 28 may assert a column address strobe 36, and the column address latches 20 may latch the transmitted column address.

Once row and column addresses are latched, the row decoder 24 may determine which row of the memory array 14 corresponds to the latched row address, and the row drivers 22 may assert a signal on the selected row. Similarly, the column decoder 18 may determine which column of the memory array 14 corresponds with the latched column address, and the quantizing circuit 16 may sense a voltage or current on the selected column. Additional details of reading and writing are described below.

FIG. 3 illustrates an example of a memory array 14. The illustrated memory array 14 includes a plurality of bit-lines 38, 40, 42, 44, and 46 (also referred to as BL0-BL4) and a plurality of word-lines 48, 50, 52, 54, 56, 58, 60, and 62 (also referred to as WL0-WL7). These bit-lines and word-lines are electrical conductors. The memory array 14 further includes a plurality of memory elements 64, each of which may be arranged to intersect one of the bit-lines and one of the word-lines. In other embodiments, imaging elements may be disposed at each of these intersections. The memory elements and imaging elements may be referred to generally as internal data storage locations, i.e., devices configured to convey data, either stored or generated by a sensor, when accessed by a sensing circuit, such as the quantizing circuits discussed below. The internal data storage locations may be formed on an integrated semiconductor device that also includes the other components of the memory device 12 (or imaging device 13).

The illustrated memory elements 64 are flash memory devices. The operation of the flash memory elements is described further below with reference to the FIGS. 4 and 5. It should be noted that, in other embodiments, the memory elements 64 may include other types of volatile or nonvolatile memory. For example, the memory elements 64 may include a resistive memory, such as a phase-change memory or magnetoresistive memory. In another example, the memory elements 64 may include a capacitor, such as a stacked or or trench capacitor. Some types of memory elements 64 may include an access device, such as a transistor or a diode associated with each of the memory elements 64, or the memory elements 64 may not include an access device, for instance in a cross-point array.

Figure 4:
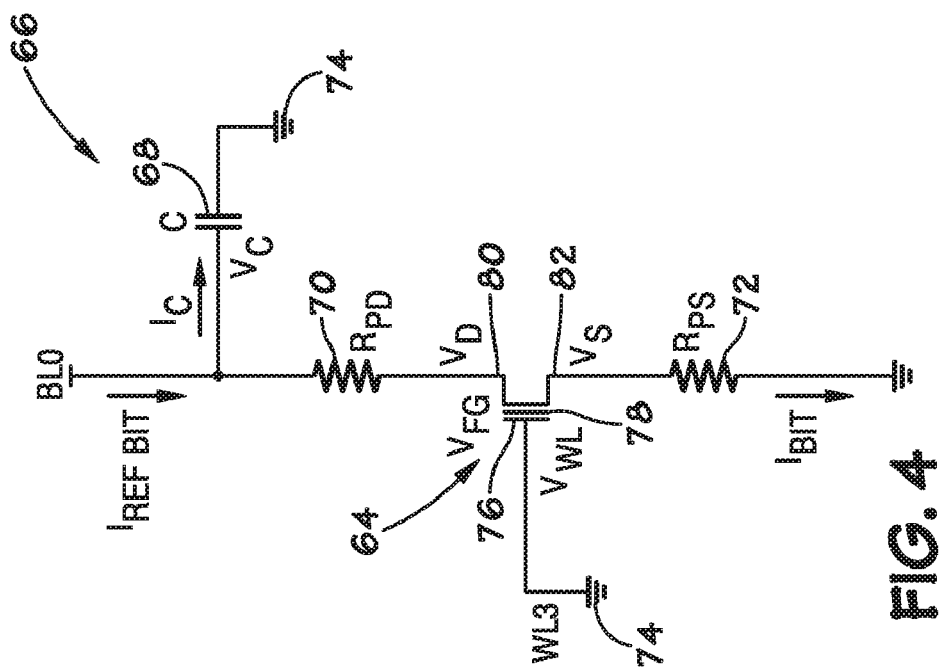
FIG. 4 illustrates a memory element in accordance with an embodiment of the present invention.

FIG. 4 illustrates a circuit 66 that models the operation of an arbitrarily selected memory element 64, which is disposed at the intersection of WL3 and BL0. This circuit 66 includes a capacitor 68, a pre-drain resistor 70 ($R_{PD}$), a post-source resistor 72 ($R_{PS}$), and a ground 74. The resistors 70 and 72 model the other devices in series the memory element 64 being sensed. The illustrated memory element 64 includes a gate 76, a floating gate 78, a drain 80, and a source 82. In the circuit 66, the drain 80 and source 82 are disposed in series between the pre-drain resistor 70 and the post-source resistor 72. The gate 76 is coupled to WL3. The pre-drain resistor 70, the drain 80, the source 82, and the post-source resistor 72 are disposed in series on the bit-line BL0. The capacitor 68, which models the capacitance of the bit-line, has one plate coupled to ground 74 and another plate coupled to the bit-line BL0, in parallel with the memory elements 64.

Several of the components of the circuit 66 represent phenomenon affecting the memory elements 64 during operation. The pre-drain resistor 70 generally represents the drain-to-bitline resistance of the memory elements 64 coupled to the bit-line above (i.e., up current from) WL3 when these memory elements 64 are turned on, (e.g., during a read operation). Similarly, the post source resistor 72 generally corresponds to the source-to-ground resistance of the memory elements 64 coupled to the bit-line below WL3 when these memory element 64 is selected. The circuit 66 models electrical phenomena associated with reading the memory elements 64 at the intersection of WL3 and BL0.

Figure 5:
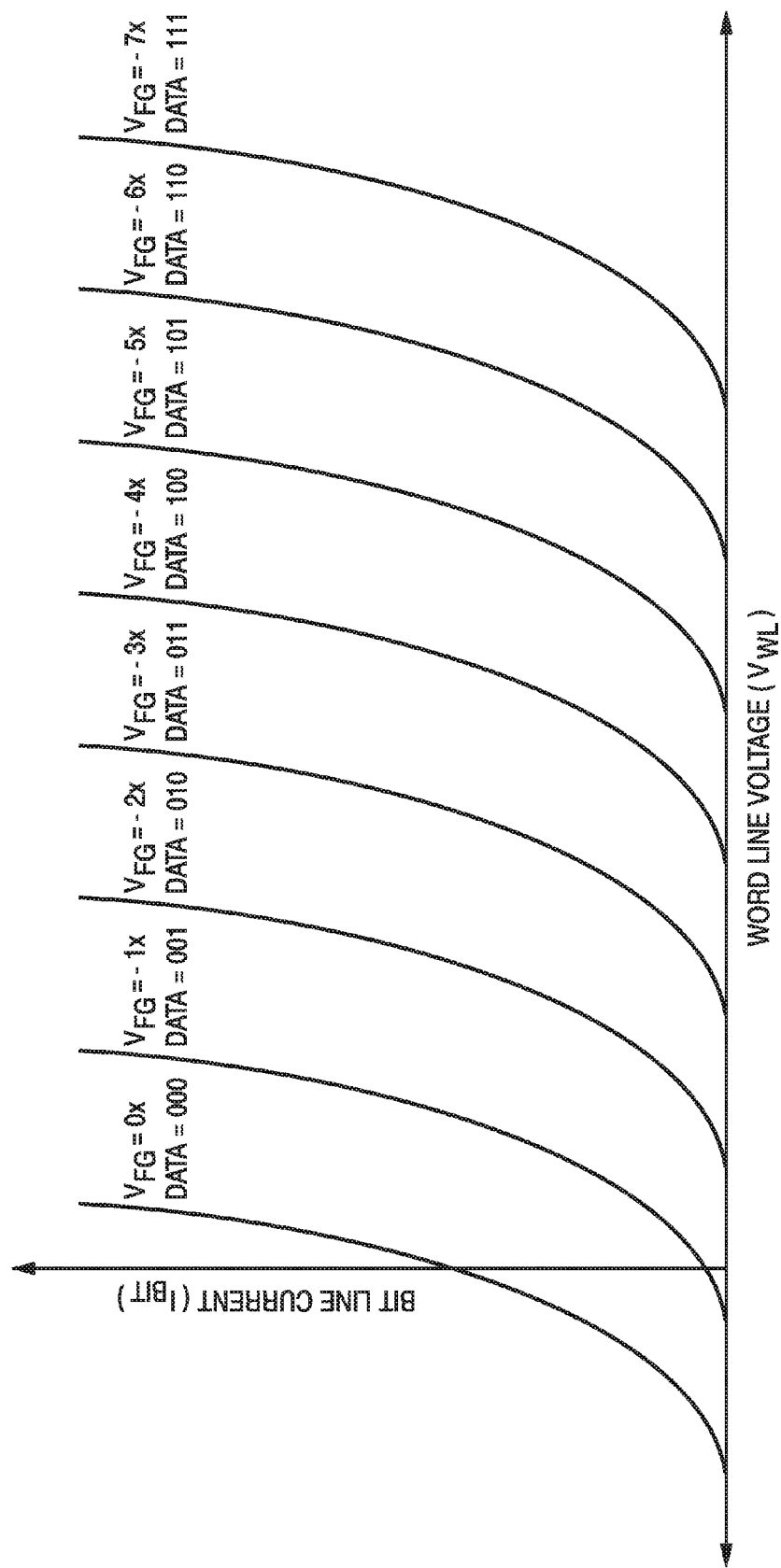
FIG. 5 illustrates I-V traces of memory elements storing different values, in accordance with an embodiment of the present invention.

The operation of the memory elements 64 will now be briefly described with reference to FIGS. 4 and 5. FIG. 5 illustrates one potential relationship between the bit-line current ($I_{Bit}$), the word-line voltage ($V_{WL}$), and the voltage of the floating gate 78 ($V_{FG}$). As illustrated by FIG. 5, $V_{FG}$ affects the response of the memory element 64 to a given $V_{WL}$. Decreasing the voltage of the floating gate shifts the I-V curve of the memory elements 64 to the right. That is, the relationship between the bit-line current and a word-line voltage depends on the voltage of the floating gate 78. The memory elements 64 may store and output data by exploiting this effect.

To write data to the memory elements 64, a charge corresponding to the data may be stored on the floating gate 78. The charge of the floating gate 78 may be modified by applying voltages to the source 82, drain 80, and/or gate 76 such that the resulting electric fields produce phenomenon like Fowler-Northam tunneling and/or hot-electron injection near the floating gate 78. Initially, the memory elements 64 may be erased by manipulating the word-line voltage to drive electrons off of the floating gate 78. In some embodiments, an entire column or block of memory elements 64 may be erased generally simultaneously. Once the memory elements 64 are erased, the gate 76 voltage may be manipulated to drive a charge onto the floating gate 78 that is indicative of a data value. After the write operation ends, the stored charge may remain on the floating gate 78 (i.e., the memory elements 64 may store data in a nonvolatile fashion).

As illustrated by FIG. 5, the value stored by the memory element 64 may be read by applying a voltage, $V_{WL}$, to the gate 76 and measuring a resulting bit-line current, $I_{Bit}$. Each of the I-V traces depicted by FIG. 5 correspond to a different charge stored on the floating gate, $V_{FG}$, which should not be confused with the voltage that is applied to the gate, $V_{WL}$. The difference in floating gate 70 voltage, $V_{FG}$, between each I-V trace is an arbitrarily selected scaling factor "x." The illustrated I-V traces correspond to eight-different data values stored by the memory element 64, with a $V_{FG}$ of 0x representing a binary data value of 000, a $V_{FG}$ of 1x representing a binary data value of 001, and so on through $V_{FG}$ of 7x, which represents a binary data value of 111. Thus, by applying a voltage to the gate 76 and measuring the resulting bit-line current, the charge stored on the floating gate 78 may be measured, and the stored data may be read.

The accuracy with which the bit-line current is sensed may affect the amount of data that a designer attempts to store in each memory element 64. For example, in a system with a low sensitivity, a single bit may be stored on each memory element 64. In such a system, a floating gate voltage $V_{FG}$ of 0x may correspond to a value of 0, and a floating gate voltage $V_{FG}$ of −7x may correspond to a value of one. Thus, the difference in floating gate voltages $V_{FG}$ corresponding to different data values may be relatively large, and the resulting differences and bit-line currents for different data values may also be relatively large. As a result, even low-sensitivity sensing circuitry may discern these large differences in bit-line current during a read operation.

In contrast, high-sensitivity sensing circuitry may facilitate storing more data in each memory element 64. For instance, if the sensing circuitry can distinguish between the eight different I-V traces depicted by FIG. 5, then the memory elements 64 may store three bits. That is, each of the eight different charges stored on the floating gate 78 may correspond to a different three-bit value: 000, 001, 010, 011, 100, 101, 110, or 111. Thus, circuitry that precisely measures the bit-line current $I_{Bit}$ may allow a designer to increase the amount of data stored in each memory element 64.

Figure 6:
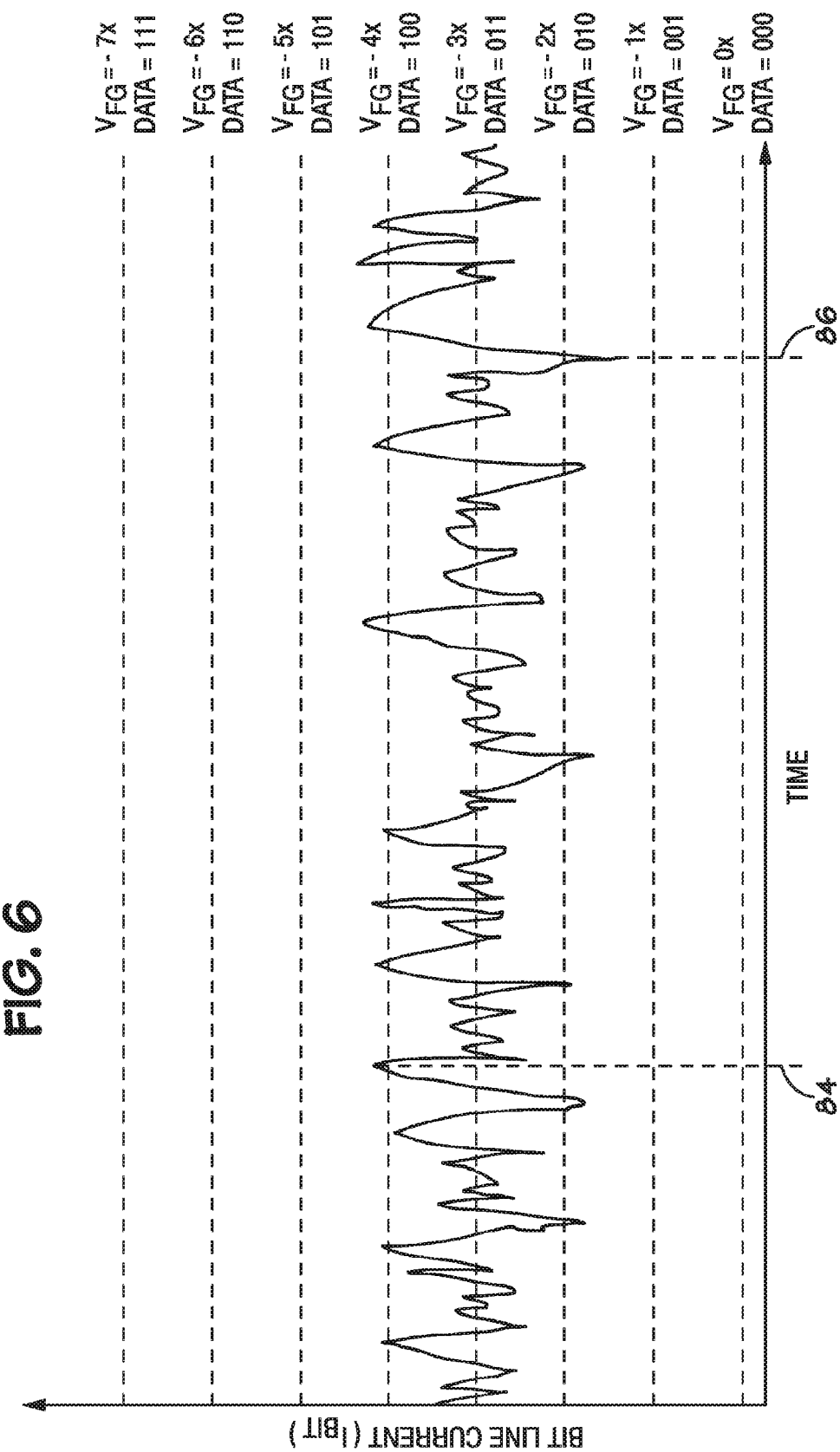
FIG. 6 illustrates noise in the bit-line current during a read operation, in accordance with an embodiment of the present invention.

However, as mentioned above, a variety of effects may interfere with accurate measurement of the bit-line current. For instance, the position of the memory elements 64 along a bit-line may affect $R_{PD}$ and $R_{PS}$, which may affect the relationship between the word-line voltage $V_{WL}$, and the bit-line current $I_{Bit}$. To illustrate these effects, FIG. 6 depicts noise in the bit-line current $I_{Bit}$ while reading from the memory element 64. As illustrated, noise in the bit-line current $I_{Bit}$ may cause the bit-line current $I_{Bit}$ to fluctuate. Occasionally, the fluctuation may be large enough to cause the bit-line current $I_{Bit}$ to reach a level that corresponds with a different stored data value, which could cause the wrong value to be read from the memory elements 64. For instance, if the bit-line current is sensed at time 84, corresponding to an arbitrarily selected peak, a data value of 100 may be read rather than the correct data value of 011. Similarly, if the bit-line current is sensed at time 86, corresponding to an arbitrarily selected local minimum, a data value of 010 may be read rather than a data value of 011. Thus, noise in the bit-line current may cause erroneous readings from memory elements 64.

Figure 7:
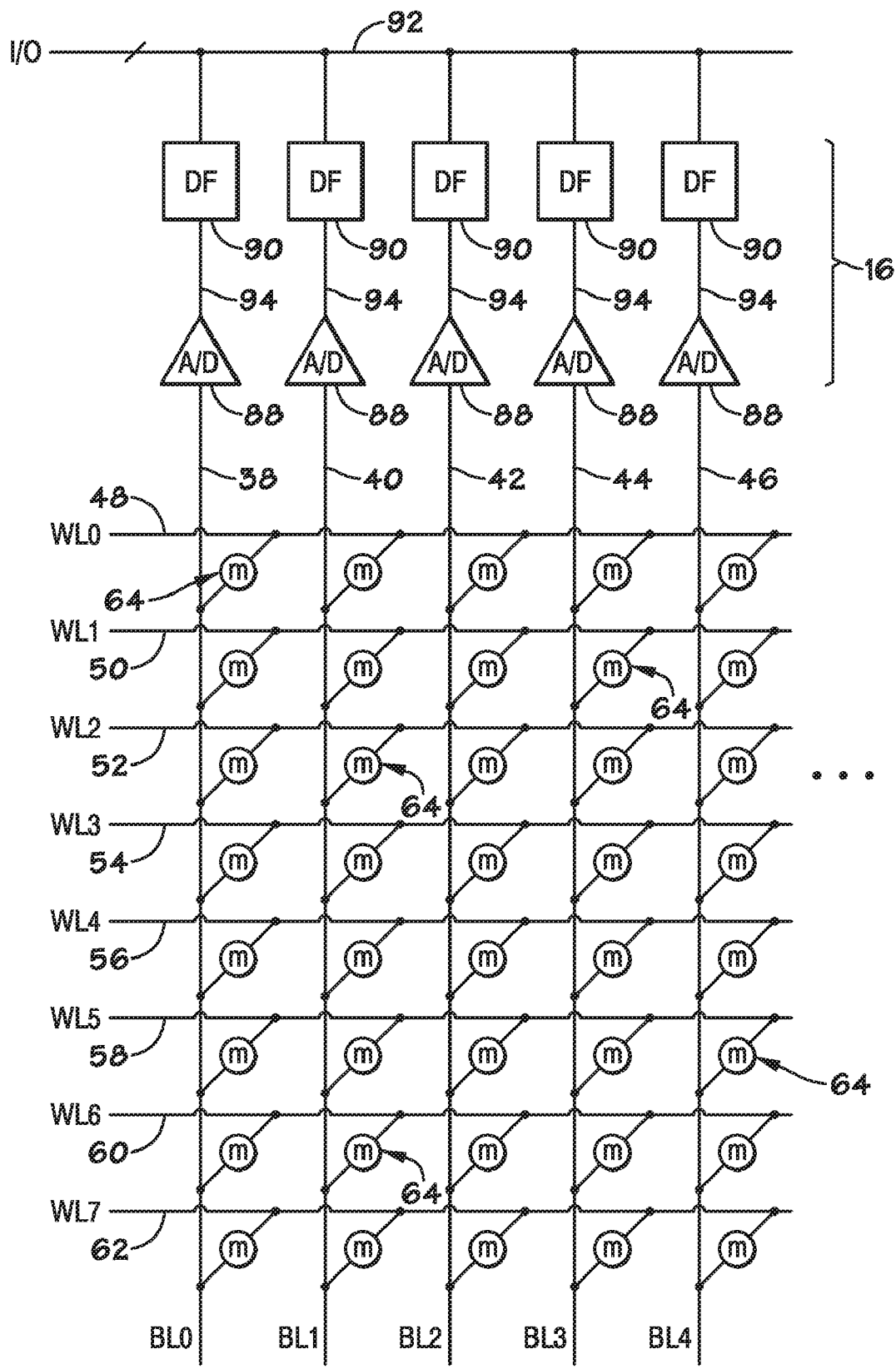
FIG. 7 illustrates a quantizing circuit in accordance with an embodiment of the present invention.

FIG. 7 depicts a quantizing circuit 16 including digital filters 90 that are believed to reduce the likelihood of an erroneous reading. In addition to the digital filters 90, the illustrated quantizing circuit 16 includes an analog-to-digital converter 88. In the present embodiment, a digital filter 90 and an analog-to-digital converter 88 is coupled to each of the bit-lines 38, 40, 42, 44, and 46, respectively. That is, each bit-line 38, 40, 42, 44, and 46 may connect to a different analog-to-digital converter 88 and digital filter 90. The digital filters 90, in turn, may connect to an input/output bus 92, which may connect to a column decoder 18, a column address latch 20, and/or control circuitry 28 (see FIG. 2).

In operation, the quantizing circuit 16 may digitize analog signals from the memory elements 64 in a manner that is relatively robust to noise. As explained below, the quantizing circuit 16 may do this by converting the analog signals into a bit-stream and digitally filtering high-frequency components from the bit-stream with a two-step process.

The analog-to-digital converter 88 may be a one-bit, analog-to-digital converter or a multi-bit, analog-to-digital converter. In the present embodiment, an analog-to-digital converter 88 receives an analog signal from the memory element 64, e.g., a bit-line current $I_{Bit}$ or a bit-line voltage $V_{BL}$, and outputs a bit-stream that corresponds with the analog signal. The bit-stream may be a one-bit, serial signal with a time-averaged value that generally represents or corresponds to the time-averaged value of the analog signal from the memory element 64. That is, the bit-stream may fluctuate between values of zero and one, but its average value, over a sufficiently large period of time, may be proportional to proportional to the average value of the analog signal from the memory element 64. In certain embodiments, the bit-stream from the analog-to-digital converter 88 may be a pulse-density modulated (PDM) representation of the analog signal. The analog-to-digital converter 88 may transmit the bit-stream to the digital filter 90 on a bit-stream signal path 94.

The digital filter 90 may remove high-frequency noise from the bit-stream. To this end, the digital filter 90 may be a low-pass filter, such as a circuit configured to calculate an average value of the bit-stream over a sensing time, i.e., the time period over which the memory element 64 is read. As a result, the digital filter 90 may output a value that is representative of both the average value of the bit-stream and the average value of the analog signal from the memory element 64. In some embodiments, such as those described below in reference to FIGS. 8-10, the digital filter 90 includes a counter and a divider, i.e., a circuit configured to perform a division operation on the output of the counter. For multi-bit memory elements 64, the output from the digital filter 90 may be a multi-bit binary signal, e.g., a digital word that is transmitted serially and/or in parallel.

Advantageously, in certain embodiments, the quantizing circuit 16 may facilitate the use of multi-bit memory elements 64. As described above, in traditional designs, the number of discrete data values that a memory element 64 stores may be limited by sense amps that react to noise. In contrast, the quantizing circuit 16 may be less susceptible to noise, and, as a result, the memory elements 64 may be configured to store additional data. Without the high frequency noise, the intervals between signals representative of different different data values may be made smaller, and the number of data values stored by a given memory element 64 may be increased. Thus, beneficially, the quantizing circuit 16 may sense memory elements 64 that store several bits of data, e.g., 2, 3, 4, 5, 6, 7, 8, or more bits per memory element 64.

Although the quantizing circuit 16 may sample the signal from the memory element 64 over a longer period of time than conventional designs, the overall speed of the memory device 12 may be improved. As compared to a conventional device, each read or write operation of the memory device 12 may transfer more bits of data into or out of the memory element 64. As a result, while each read or write operation may take longer, more data may be read or written during the operation, thereby improving overall performance. Further, in some memory devices 12, certain processes may be performed in parallel with a read or write operation, thereby further reducing the overall impact of the longer sensing time. For example, in some embodiments, the memory array 14 may be divided into banks that operate at least partially independently, so that, while data is being written or read from one bank, another bank can read or write data in parallel.

Figure 8:
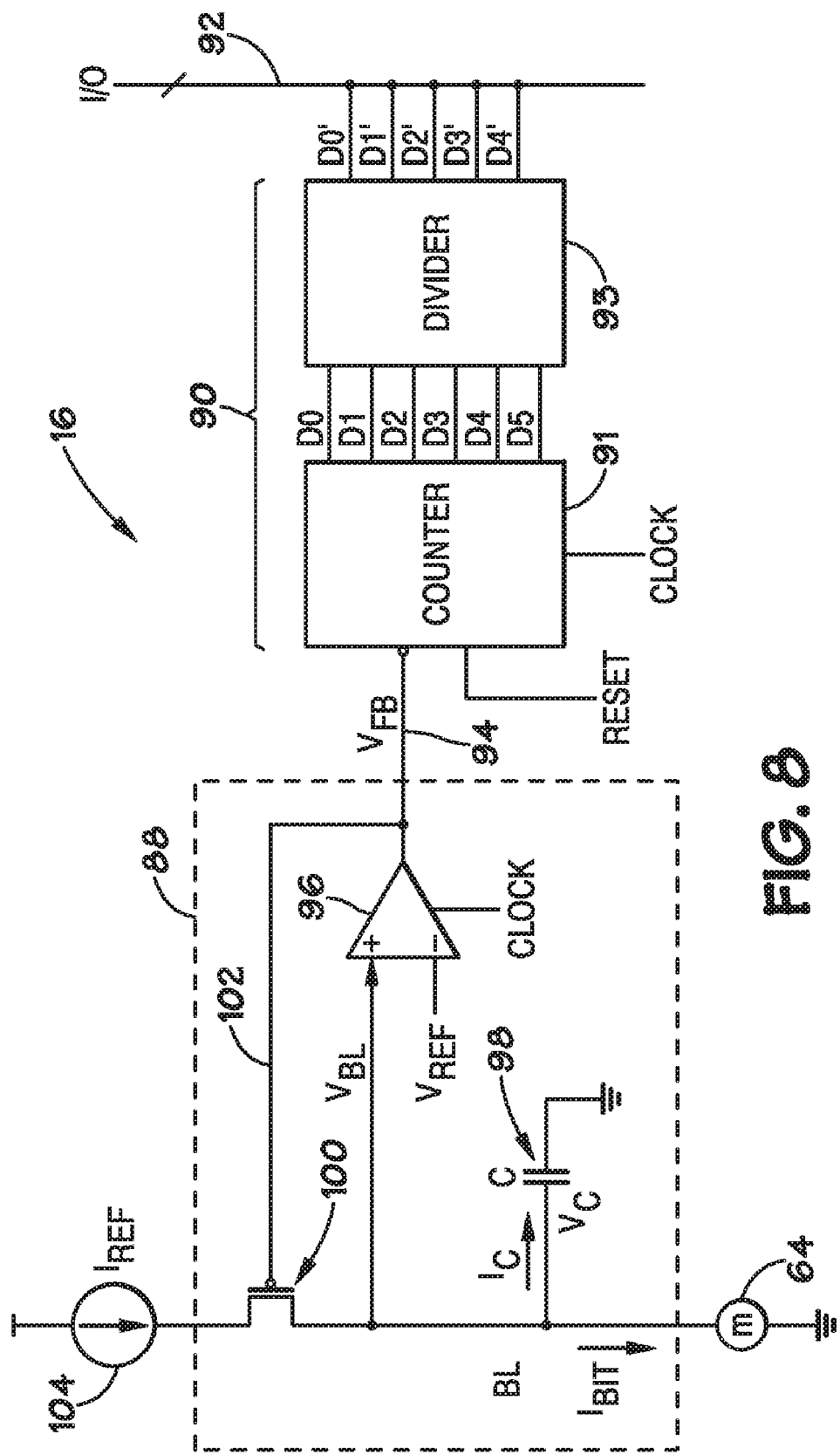
FIG. 8 illustrates a delta-sigma sensing circuit in accordance with an embodiment of the present invention.

FIG. 8 illustrates details of one implementation of the quantizing circuit 16. In this embodiment, the digital filter 90 includes a counter 91 and a divider 93, and the analog-to-digital converter 88 is a first-order delta-sigma modulator. The illustrated delta-sigma modulator 88 may include a latched comparator 96 (hereinafter the "comparator"), a capacitor 98, and a switch 100. In other embodiments, other types of digital filters and analog-to-digital converters may be employed.

In the embodiment of FIG. 8, an input of the counter 91 may connect to the bit-stream signal path 94, which may connect to an output of the comparator 96. The output of the comparator 96 may also connect to a gate of the switch 100 by a feedback signal path 102. The output terminal (e.g., source or drain) of the switch 100 may connect in series to one of the bit-lines 38, 40, 42, 44, or 46, and the input terminal of the switch 100 may connect to a reference current source 104 ($I_{Ref}$). One plate of the capacitor 98 may connect to one of the bit-lines 38, 40, 42, 44, or 46, and the other plate of the capacitor 98 may connect to ground.

The illustrated counter 91 counts the number of clock cycles that the bit-stream 94 is at a logic high value or a logic low value during the sampling period. The counter may count up or count down, depending on the embodiment. In some embodiments, the counter 91 may do both, counting up one for each clock cycle that the bit-stream has a logic high value and down one for each clock cycle that the bit-stream has a logic low value. Output terminals (D0-D5) of the counter 91 may connect to the divider 93, which may include output terminals (D0'-D4') that connect to the input/output bus 92 for transmitting the average. The counter 91 may be configured to be reset to zero or some other value when a reset signal is asserted. In some embodiments, the counter 91 may be a series connection of D-flip flops, e.g., D-flip flops having SRAM or other memory for storing an initial value and/or values to be written to the memory element 64. The divider 93 may be configured to divide a count from the counter 91 by a divisor to calculate an average.

In the illustrated embodiment, the clocked comparator 96 compares a reference voltage ($V_{Ref}$) to the voltage of one of the bit-lines 38, 40, 42, 44, or 46 ($V_{BL}$), which may be generally equal to the voltage of one plate of the capacitor 98. The comparator 96 may be clocked (e.g., falling and/or rising edge triggered), and the comparison may be performed at regular intervals based on the clock signal, e.g., once per clock cycle. Additionally, the comparator 96 may latch, i.e., continue to output, values ($V_{FB}$) between comparisons. Thus, when the clock signals the comparator 96 to perform a comparison, if $V_{BL}$ is less than $V_{Ref}$ then the comparator 96 may latch its output to a logic low value, as described below with reference to FIG. 9. Conversely, if $V_{BL}$ is greater than $V_{Ref}$, then the comparator 96 may latch a logic high value on its output, as described below with reference to FIG. 10. As a result, the illustrated comparator 96 outputs a bit-stream that indicates whether $V_{BL}$ is larger than $V_{Ref}$, where the indication is updated once per clock cycle.

Advantageously, in some embodiments, the quantizing circuit 16 may include a single comparator (e.g., not more than one) for each column of multi-level memory elements 64. In contrast, conventional sense amplifiers often include multiple comparators to read from a multi-bit memory cell, thereby potentially increasing device complexity and cost.

The capacitor 98 may be formed by capacitive coupling of the bit-lines 38, 40, 42, 44, and 46. In other designs, this type of capacitance is referred to as parasitic capacitance because it often hinders the operation of the device. However, in this embodiment, the embodiment, the capacitor 98 may be used to integrate differences between currents on the bit-lines 38, 40, 42, 44, or 46 and the reference current to form the bit-stream, as explained further below. In some embodiments, the capacitor 98 may be supplemented or replaced with an integrated capacitor that provides greater capacitance than the "parasitic" bit-line capacitance.

Figure 9:
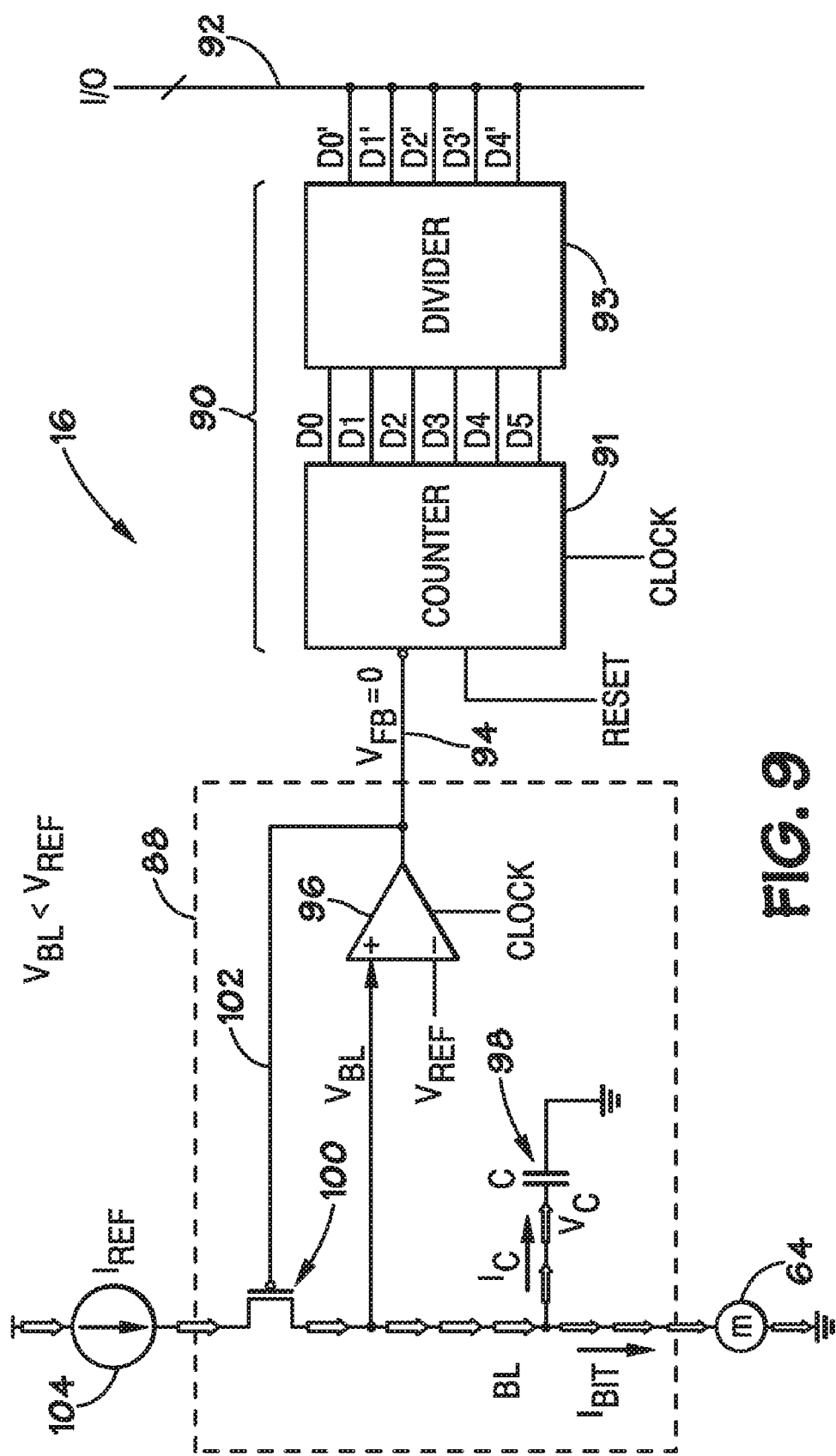
FIGS. 9 and 10 illustrate current flow during operation of the quantizing circuit of FIG. 8.
Figure 10:
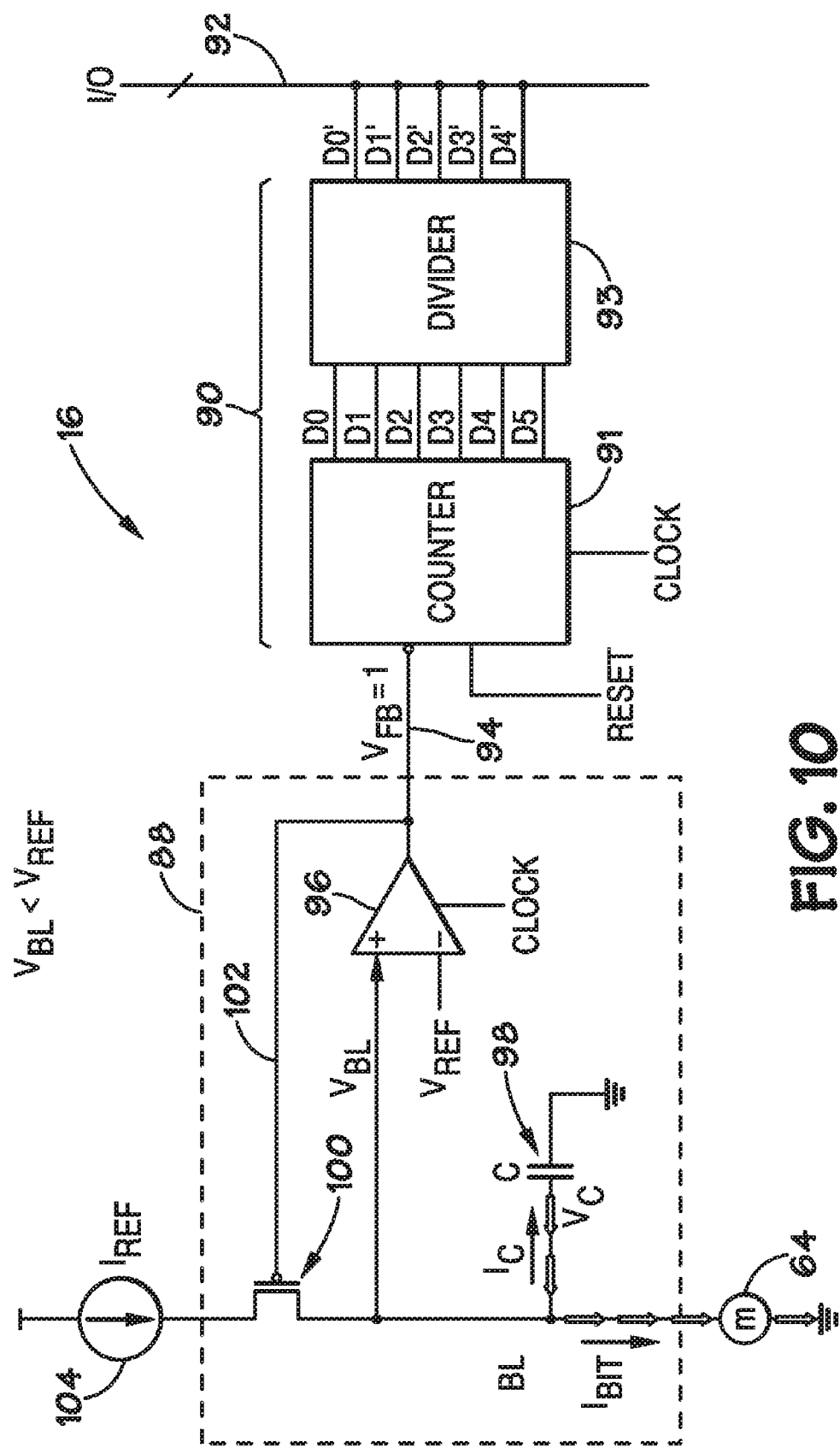

The illustrated switch 100 selectively transmits current $I_{Ref}$ from the reference current source 104. In various embodiments, the switch 100 may be a PMOS transistor (as illustrated in FIGS. 8-10) or an NMOS transistor (as illustrated in FIG. 17) controlled by the $V_{FB}$ signal on the feedback signal path 102.

Figure 11:
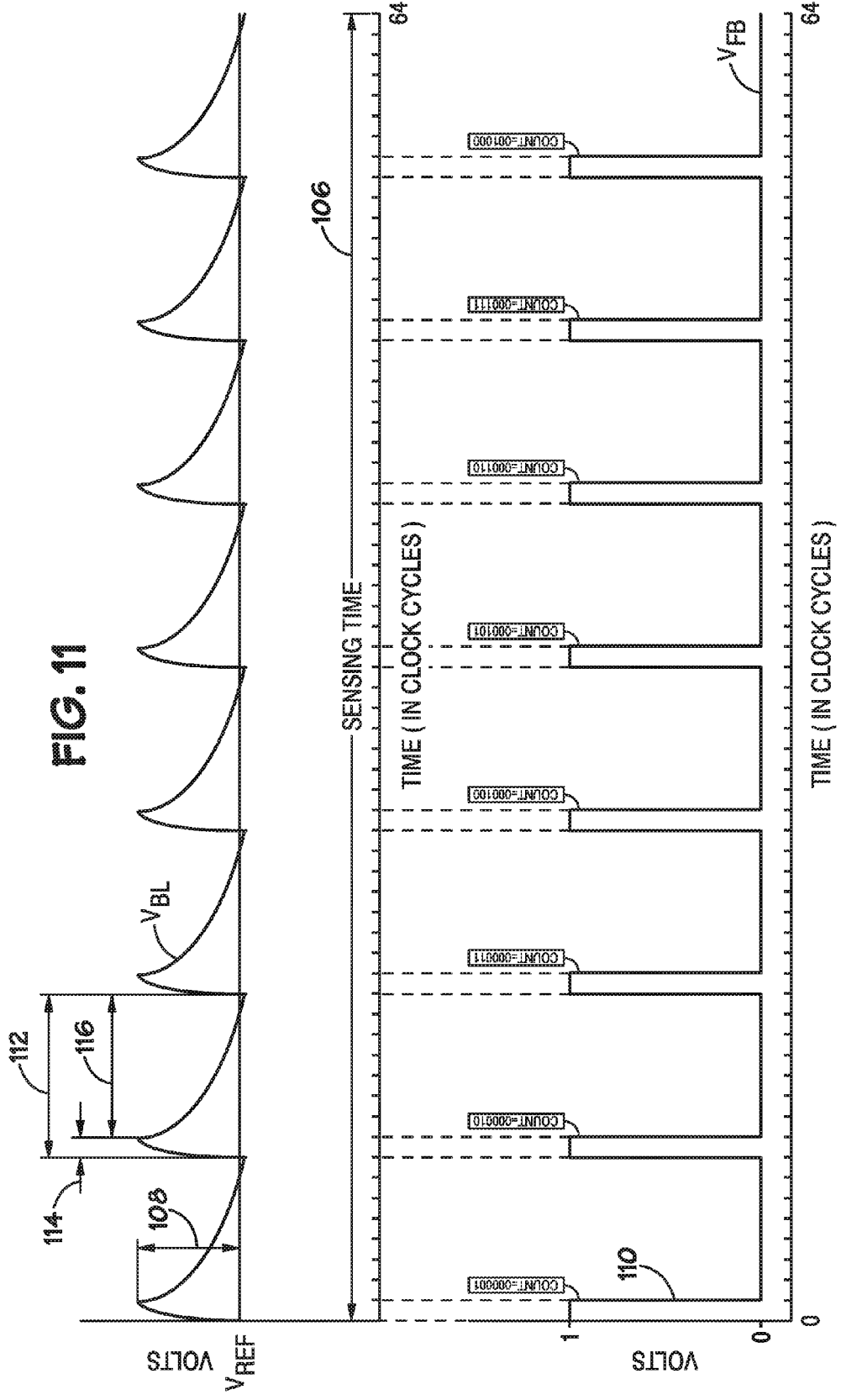
FIGS. 11-13 illustrate voltages in the quantizing circuit of FIG. 8 when sensing small, medium, and large currents, respectively.
Figure 12:
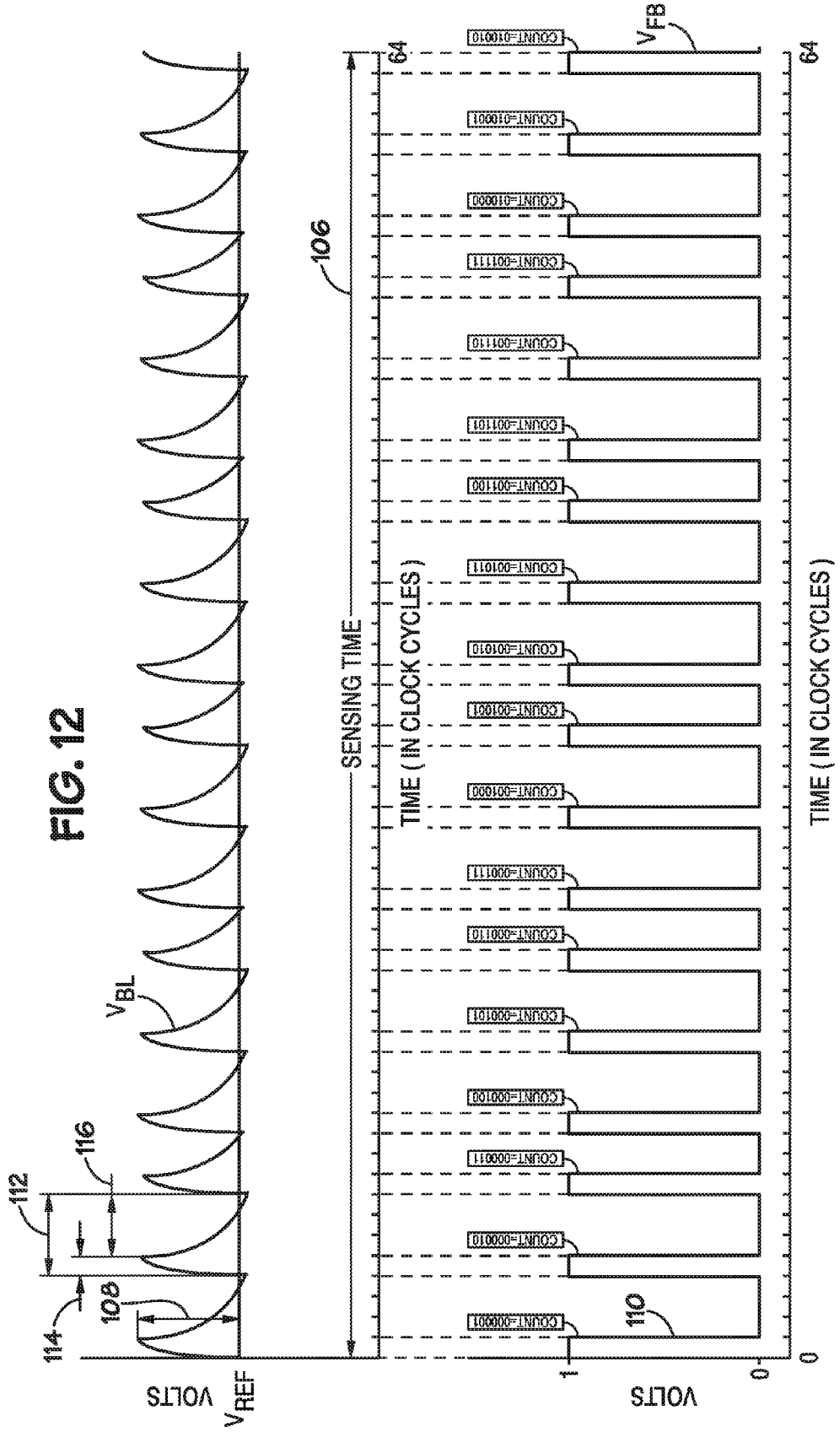
Figure 13:
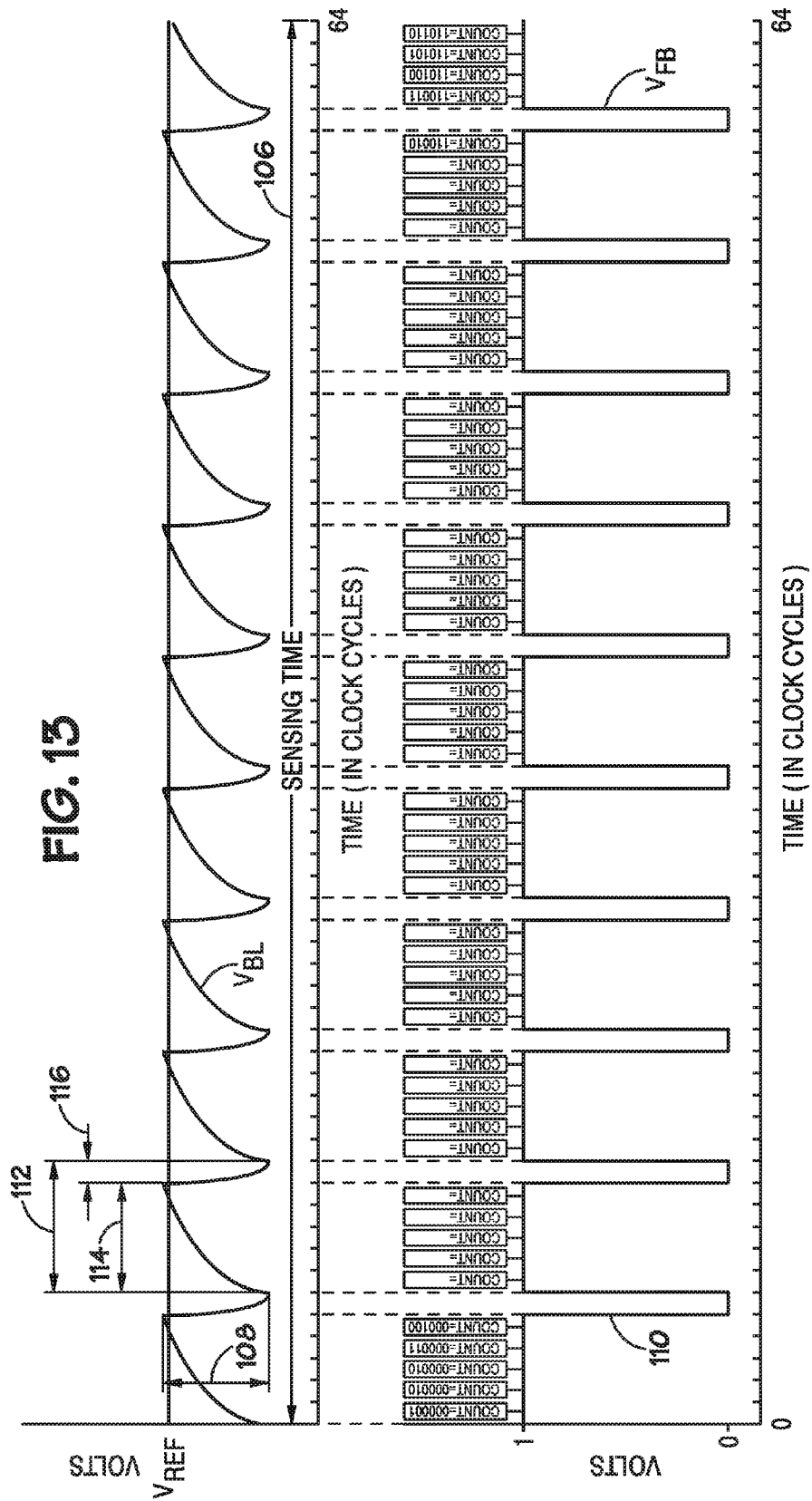

The operation of the quantizing circuit 16 will now be described with reference to FIGS. 9-12. Specifically, FIGS. 9 and 10 depict current flows in the quantizing circuit 16 when the comparator 96 is latched low and high, respectively. FIG. 11 illustrates $V_{BL}$, the bit-stream output from the comparator 96, and the corresponding increasing count of the counter 91 for a relatively small bit-line current. Similarly, FIG. 12 depicts the same voltages when measuring a medium sized bit-line current, and FIG. 13 depicts these voltages when measuring a relatively large bit-line current.

To measure the current through the memory element 64, the illustrated delta-sigma modulator 88 exploits transient effects to generate a bit-stream representative of the bit-line current. Specifically, the delta-sigma modulator 88 may repeatedly charge and discharge the capacitor 98 with a current divider that subtracts the bit-line current from the from the reference current. Consequently, a large current through the memory element 64 may rapidly discharge the capacitor 98, and a small current through the memory element 64 may slowly discharge the capacitor 98.

To charge and discharge the capacitor 98, the delta-sigma modulator 88 switches between two states: the state depicted by FIG. 9 (hereinafter "the charging state") and the state depicted by FIG. 10 (hereinafter "the discharging state"). Each time the delta-sigma modulator 88 changes between these states, the bit-stream changes from a logic high value to a logic low value or vice versa. The proportion of time that the delta-sigma modulator 88 is in the state illustrated by either FIG. 9 or FIG. 10 may be proportional to the size of the bit-line current through the memory element 64. The larger the bit-line current, the more time that the delta-sigma modulator 88 is in the state illustrated by FIG. 9 rather than the state illustrated by FIG. 10, and the more time that the bit-stream has a logic low value.

Starting with the charging state (FIG. 9), the capacitor 98 may initially accumulate a charge. To this end, the output of the comparator 96 is latched to logic low, which, as mentioned above, may occur when $V_{BL}$ is less than $V_{Ref}$. The logic low may be conveyed to switch 100 by the feedback signal path 102, and the switch 100 may close, thereby conducting the reference current, $I_{Ref}$, through one of the bit-lines 38, 40, 42, 44, or 46, as indicated by the larger arrows in FIG. 9. A portion of the electrons flowing through the reference current source 104 may be stored by the capacitor 98, as indicated by the smaller-horizontal arrows, and the remainder may be conducted through the memory element 64, element 64, i.e., the bit-line current, $I_{Bit}$, as indicated by the smaller vertical arrows. Thus, the capacitor 98 may accumulate a charge, and $V_{BL}$ may increase.

The comparator 96 and the reference current source 104 may cooperate to charge the capacitor 98 for a discrete number of clock cycles. That is, when the delta-sigma modulator 88 enters the charging state, the delta-sigma modulator 88 may remain in this state for an integer number of clock cycles. In the illustrated embodiment, the comparator 96, the output of which is latched, changes state no more than once per clock cycle, so the switch 100, which is controlled by the output of the comparator 96, $V_{FB}$, conducts current for a discrete number of clock cycles. As a result, the reference current source 104 conducts current $I_{Ref}$ through the bit-line and into the capacitor 98 for an integer number of clock cycles.

After each clock cycle of charging the capacitor 98, the delta-sigma modulator 88 may transition from the charging state to the discharging state, which is illustrated by FIG. 10, depending on the relative values of $V_{BL}$ and $V_{Ref}$. Once per clock cycle (or at some other appropriate interval, such as twice per clock cycle), the comparator 96 may compare the voltage of the capacitor $V_{BL}$ to the reference voltage $V_{Ref}$. If the capacitor 98 has been charged to the point that $V_{BL}$ is greater than $V_{Ref}$, then the output of the comparator 96 may transition to logic high, as illustrated in FIG. 10. The logic high signal may be conveyed to the switch 100 by the feedback signal path 102, thereby opening the switch 100. As a result, the reference current source 104 may cease flowing current through the memory current through the memory element 64 and into the capacitor 98, and the capacitor 98 may begin to discharge through the memory element 64.

In the present embodiment, the delta-sigma modulator 88 discharges the capacitor 98 for a discrete number of clock intervals. After each clock cycle of discharging the capacitor 98, the delta-sigma modulator 88 compares $V_{BL}$ to $V_{Ref}$. If $V_{BL}$ is still greater than $V_{Ref}$, then the comparator 96 may continue to output a logic high signal, i.e., $V_{FB}=1$, and the switch 100 remains open. On the other hand, if enough current has flowed out of the capacitor 98 that $V_{BL}$ is less than $V_{Ref}$, then the comparator 96 may output a logic low signal, i.e., $V_{FB}=0$, and the switch 100 may close, thereby transitioning the delta-sigma modulator 88 back to the charging state and initiating a new cycle.

FIGS. 11-13 illustrate voltages $V_{FB}$ and $V_{BL}$ in the quantizing circuit 16 when reading a memory element 64. Specifically, FIG. 11 illustrates a low-current case, in which the value stored by the memory element 64 corresponds to a relatively low bit-line current; FIG. 12 illustrates a medium-current case; and FIG. 13 illustrates a high-current case. In each of these figures, the ordinate of the lower trace represents the voltage of the bit-stream signal path 94, $V_{FB}$, and the ordinate of the upper trace illustrates the bit-line voltage, $I_{Bit}$. The abscissa in each of the traces represents time, with the lower trace synchronized with the upper trace, and the duration of the time axes is one sensing time 106.

As illustrated by FIG. 11, the counter 91 is initially set to zero (or some other appropriate value, such as one half of the divisor, as explained below) by asserting a reset signal. In some embodiments, the delta-sigma modulator 88 may undergo a number of start-up cycles to reach steady-state operation before initiating the sensing time and resetting the counter 91. At the beginning of the illustrated read operation, the delta-sigma modulator 88 is in the charging state, which charges the capacitor 98 and increases $V_{BL}$, as indicated by dimension arrow 108. At the beginning of the next clock cycle, the comparator 96 compares the bit-line voltage to the reference voltage and determines that the bit-line voltage is greater than the reference voltage. As a result, the bit-stream signal path 94 ($V_{FB}$) transitions to a logic high voltage, and the delta-sigma modulator 88 transitions to the discharging state. Additionally, the counter 91 increments the count by one to account for one clock cycle of the bit-stream signal 94 holding a logic low value. Next, the charge stored on the capacitor 98 drains out through the memory element 64, and the bit-line voltage drops until the comparator 96 detects that $V_{BL}$ is less than $V_{Ref}$, at which point the cycle repeats. The cycle has a period 112, which may be divided into a charging portion 114 and a discharging portion 116. Once during each cycle in the sensing time 106, the count stored in the counter 91 may increase by one. At the end of the sensing time 106, the counter 91 may output the total count.

A comparison of FIG. 11 to FIGS. 12 and 13 illustrates why the count correlates with the bit-line current. In FIG. 13, the high-current case, the stored charge drains from the capacitor 98 quickly relative to the other cases because the bit-line current is large and, as a result, the delta-sigma modulator 88 spends more time in the charging state than the the discharging state. As a result, the bit-stream has a logic low value for a large portion of the sensing time 106, thereby increasing the count. FIG. 14 illustrates the generally proportional relationship between the bit-line current and the count.

Details of one embodiment of the divider 93 will now be described with reference to FIG. 15. The divider 93 in FIG. 15 embodies a special case of division in which the dividend is base 2 and the divisor is $2^n$, where n is an integer. In this case, i.e., when the divisor is an exponent of the base of the numbering system of the count, then the divider 93 may be implemented by dropping less-significant bits of the count. The number of less-significant bits that are dropped may be equal to n. For instance, in the embodiment of FIG. 15, the divisor is 1000 in base 2 (i.e., $2^3$ or 8 in base 10), so n equals 3 and the 3, least-significant bits are dropped.

FIG. 16 is a graph illustrating the relationship between the input and the output of the divider 93 of FIG. 15. As illustrated, the divider 93 output is generally equal to the three most-significant bits of the count, and the three least-significant bits of the count are dropped, i.e. not passed on to the input/output bus 92. The illustrated divider 93 rounds its output down to the nearest integer. However, in other embodiments, the divider 93 may round its output up to the nearest integer.

In other embodiments, the divisor may have a different value. For example, the divisor may be a larger or smaller exponent of the base of the numbering system of the count. In another example, the divisor may not be an exponent of the base of the numbering system of the count. In some embodiments, the counter 91 may be integrated with the divider 93, and the counter 91 may increment the count by one for every n clock cycles that the bit-stream is logic high.

Advantageously, averaging the value of the bit-stream removes high-frequency noise from the signal. As a result, the measurements of the bit-line current are believed to be more accurate, and the memory element 64 may store additional data, in certain embodiments.

FIG. 16 illustrates the relationship between divider output and count for one embodiment. In FIG. 16, the abscissa represents the count, and the ordinate represents the output of the divider. In the present embodiment, the three-least-significant digits of the count are disregarded as noise. That is, D0-D2 (FIG. 8) either do not connect to the input/output bus 92 or are not interpreted as conveying data stored by the memory element 64. As a result, a range of counter values may represent a single data value stored by the memory device 64. For example, in the present embodiment, counter values ranging from 001 000 to 001 111 are construed as representing a data value of 001. Representing data in this manner is believed to further reduce the effects of noise because, even if noise affects the count, in many embodiments, it would have to affect the count in a consistent manner over a long period of time to affect the more significant digits of the count. That is, disregarding less significant digits is believed to lower the cutoff frequency of the counter 90. In other embodiments, fewer, more, or no digits may be truncated from the count as potentially representing noise.

FIG. 17 depicts an example of a read operation 118 that is performed by certain embodiments of the quantizing circuit 16. The read operation 118 begins with presetting the counter, as illustrated by block 120. In the present embodiment, the counter is preset to one-half of the divisor to average out the effect of the divider rounding down to the nearest integer. In embodiments in which the divider 93 rounds up to the nearest integer, the count may be preset to negative-one-half of the divisor. Alternatively, the counter may be set to zero.

Next, the reference current is conducted both into the capacitor and through the memory cell, as illustrated by block 122. Then, a determination is made as to whether a new clock cycle has started, as depicted by block 124. Depending on the result, the read operation 118 either returns to block 122 or continues to block 126, where a determination is made as to whether the voltage of the capacitor is greater than a reference voltage. Depending on the result, the read operation 118 either returns to block 122 or continues to block 128, at which point the reference current is no longer conducted. Next, the capacitor is discharged through the memory element, as depicted by block 130, and a determination is made as to whether a new clock cycle has started, as depicted by block 134. Based on the results of the determination, either the capacitor continues to discharge through the memory cell, as described by block 130, or the count is increased by one, as depicted by block 136. Then, a determination is made as to whether the voltage of the capacitor is less than the reference voltage, as depicted by block 138. Based on the result of the determination, the read operation 118 either returns to block 130 to continue discharging the capacitor or continues to block 140, where a determination is made as to whether the sensing time has elapsed. Based on the determination at block 140, the read operation 118 either returns to block 122 to initiate a new charge and discharge cycle or outputs a count new charge and discharge cycle or outputs a count from the counter to the divider, as depicted by block 142.

The divider may then divide the count by the divisor, as illustrated by block 143. In certain cases, this step may be performed by dropping less significant bits from the count. Next, the average value is output, as illustrated by block 144. Outputting the average value may include storing the average value in memory, transmitting the average value to another component, displaying the average value, or using the average value in subsequent calculations.

FIG. 18 illustrates an exemplary write operation 146. The illustrated write operation 146 begins with erasing the memory element, as illustrated by block 148. In some embodiments, a block or cell of memory elements may be erased generally simultaneously. Next, a memory-element property that is used to store data is adjusted by one increment, as illustrated by block 150. Adjusting a memory-element property may include driving a charge on to a floating gate or partially changing the phase of a phase-change memory element. After adjusting the memory-element property, the memory element is read, as illustrated by block 152. This step may include performing the read operation 118 illustrated in FIG. 17. After reading the memory element, it is determined whether the value stored by the memory element is generally equal to the target value to be written to the memory element, as illustrated by block 154. If the value to be written is not generally equal to the value to be stored, then the memory element property may be adjusted by another increment, and the operation 146 may return to block 150. On the other hand, if the value stored by the memory element is generally equal to the target value, then the write operation 146 may end, as illustrated by block 156.

Figure 19:
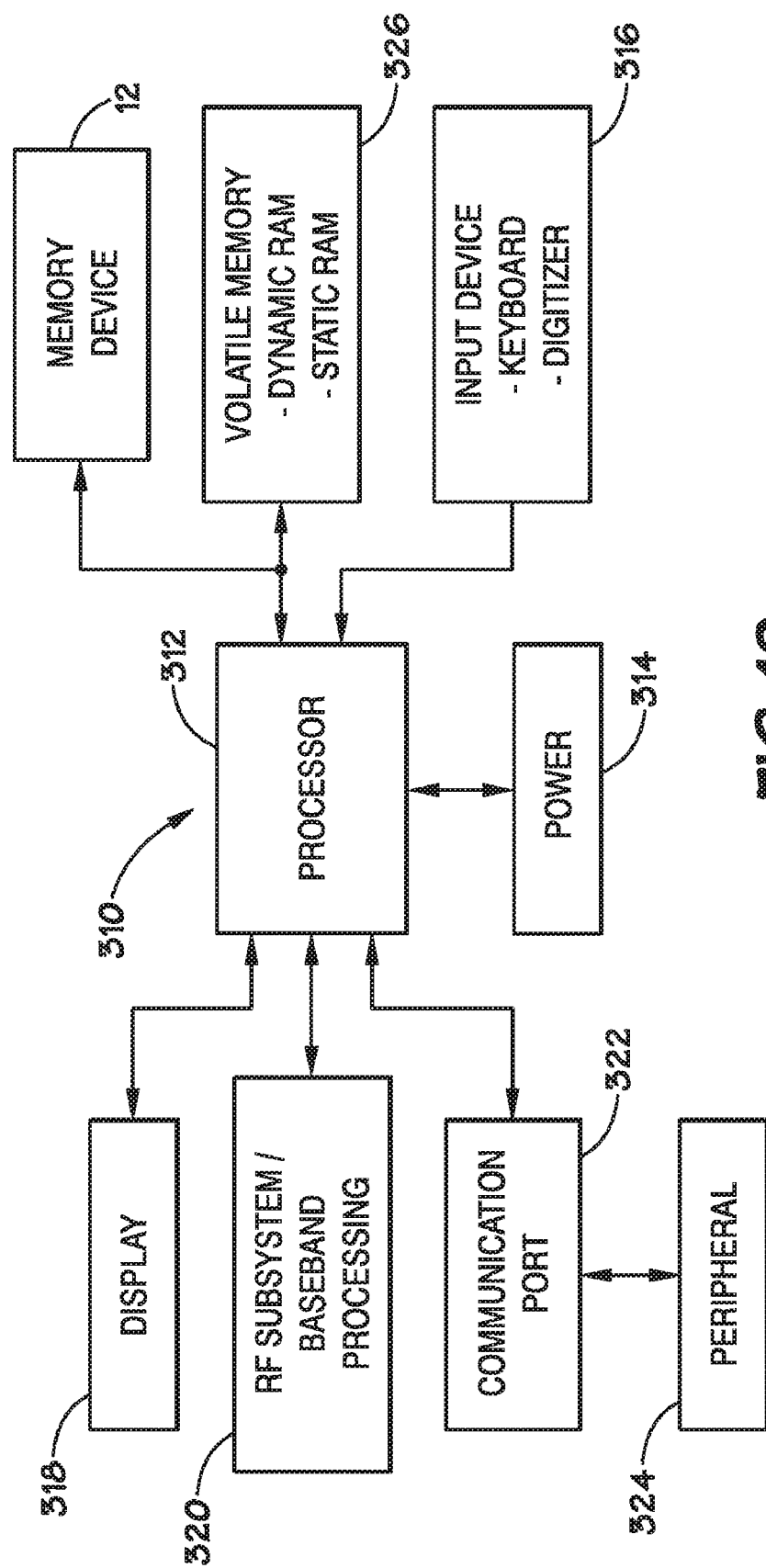
FIG. 19 is an example of a system that includes the memory device of FIG. 2 in accordance with an embodiment of the present invention.

FIG. 19 depicts an exemplary processor-based system 310 that includes the memory device 12. Alternatively or additionally, the system 310 may include the imaging device 13. The system 310 may be any of a variety of types such as a computer, pager, cellular phone, personal organizer, control circuit, etc. In a typical processor-based system, one or more processors 312, such as a microprocessor, control the processing of system functions and requests in the system 310. The processor 312 and other subcomponents of the system 310 may include quantizing circuits, such as those discussed above.

The system 310 typically includes a power supply 314. For instance, if the system 310 is a portable system, the power supply 314 may advantageously include a fuel cell, permanent batteries, replaceable batteries, and/or rechargeable batteries. The power supply 314 may also include an AC adapter, so the system 310 may be plugged into a wall outlet, for instance. The power supply 314 may also include a DC adapter such that the system 310 may be plugged into a vehicle cigarette lighter, for instance.

Various other devices may be coupled to the processor 312 depending on the functions that the system 310 performs. For instance, a user interface 316 may be coupled to the processor 312. The user interface 316 may include buttons, switches, a keyboard, a light pen, a mouse, a digitizer and stylus, and/or a voice recognition system, for instance. A display 318 may also be coupled to the processor 312. The display 318 may include an may include an LCD, an SED display, a CRT display, a DLP display, a plasma display, an OLED display, LEDs, and/or an audio display, for example. Furthermore, an RF sub-system/baseband processor 320 may also be coupled to the processor 312. The RF sub-system/baseband processor 320 may include an antenna that is coupled to an RF receiver and to an RF transmitter (not shown). One or more communication ports 322 may also be coupled to the processor 312. The communication port 322 may be adapted to be coupled to one or more peripheral devices 324 such as a modem, a printer, a computer, or to a network, such as a local area network, remote area network, intranet, or the Internet, for instance.

The processor 312 generally controls the system 310 by implementing software programs stored in the memory. The memory is operably coupled to the processor 312 to store and facilitate execution of various programs. For instance, the processor 312 may be coupled to the volatile memory 326 which may include Dynamic Random Access Memory (DRAM) and/or Static Random Access Memory (SRAM). The volatile memory 326 is typically large so that it can store dynamically loaded applications and data. As described further below, the volatile memory 326 may be configured in accordance with embodiments of the present invention.

The processor 312 may also be coupled to the memory device 12. The memory device 12 may include a read-only memory (ROM), such as an EPROM, and/or flash memory to be used in conjunction with the volatile memory 326. The size of the ROM is typically selected to be just large enough to store any necessary operating system, application programs, and fixed data. Additionally, the non-volatile memory 328 may include a high capacity memory such as a tape or disk drive memory.

The memory device 10 and volatile memory 326 may store various types of software, such as an operating system or office productivity suite including a word processing application, a spreadsheet application, an email application, and/or a database application.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An electronic device, comprising:
   an internal data storage location; and
   a digital filter coupled to the internal data storage location, wherein the digital filter comprises a counter and a divider, wherein the divider is configured to divide a count from the counter by a divisor, and wherein the divider is configured to transmit a first number of the most significant bits output from the counter and not transmit a second number of the least significant bits output from the counter.

2. The electronic device of claim 1, wherein the internal data storage location comprises a data source selected from a floating-gate transistor, a phase-change memory element, a magneto-resistive memory element, or a photo-diode.

3. The electronic device of claim 1, wherein the internal data storage location and digital filer are disposed on an integrated semiconductor device.

4. The electronic device of claim 1, wherein the counter comprises a plurality of D flip-flops connected in series.

5. The electronic device of claim 1, wherein the digital filter is coupled to the internal data storage location by an analog-to-digital converter.

6. The electronic device of claim 5, wherein the analog-to-digital converter comprises:
   a comparator having first and second inputs and an output, wherein the output of the comparator is coupled to the digital filter, wherein the first input is coupled to an electrical conductor, and wherein the second input is coupled to a reference voltage source;
   a capacitor having one plate coupled to the electrical conductor; and
   a switch coupled to the electrical conductor in series with the internal data storage location, wherein the switch comprises a gate coupled to the output of the comparator.

7. An electronic device, comprising:
   a plurality of internal data storage locations coupled to an electrical conductor in series; and
   a digital filter comprising:
      a counter with an output and an input, wherein the input is coupled to the plurality of internal data storage locations via the electrical conductor; and
      a divider with an input and an output, wherein the input is coupled to the output of the counter;
      wherein the counter is coupled to memory storing a preset value that is generally equal to an average rounding error of the divider.

8. The electronic device of claim 7, wherein each of the internal data storage locations comprises a photo-diode.

9. The electronic device of claim 7, comprising an analog-to digital converter that is configured to output a pulse-density modulated bit-stream that has an average value that is generally proportional to the current through the electrical conductor.

10. The electronic device of claim 9, wherein the divider is integrated with the counter and the counter is configured to increment a count by one when the bit-stream has a predetermined logic value at a predetermined time in a clock cycle.

11. The electronic device of claim 10, wherein the digital filter is configured to output two or more of the most significant bits of a count formed by the counter and not output one or more less significant bits of the count.

12. An electronic device, comprising:
   an internal data storage location of a semiconductor device;
   a counter coupled to the internal data storage location; and
   a divider coupled to an output of the counter, wherein the divider is configured to transmit a first portion of the output of the counter in an output of the divider and disregard a second portion of the output of the counter.

13. The electronic device of claim 12, wherein the internal data storage location comprises a floating gate transistor.

14. The electronic device of claim 12, comprising a delta-sigma modulator, wherein the counter is connected to the internal data storage location via the delta-sigma modulator.

15. The electronic device of claim 12, wherein the first portion of the output of the counter includes more significant bits than second portion of the output of the counter.

16. An electronic device, comprising:
   an internal data storage location of a semiconductor device;
   a counter coupled to the internal data storage location;
   a divider coupled to an output of the counter; and
   a delta-sigma modulator, wherein the counter is connected to the internal data storage location via the delta-sigma modulator.

17. The electronic device of claim 16, wherein the internal data storage location comprises a floating gate transistor.

18. The electronic device of claim 16, comprising a delta-sigma modulator, wherein the counter is connected to the internal data storage location via the delta-sigma modulator.

19. The electronic device of claim 16, wherein the divider comprises a digit of the counter.

20. The electronic device of claim 19, wherein the digit of the counter comprised by the divider is more significant than the other digit of the counter that is not comprised by the divider.

* * * * *

UNITED STATES PATENT AND TRADEMARK OFFICE
CERTIFICATE OF CORRECTION

| | | |
|---|---|---|
| PATENT NO. | : 8,149,646 B2 | Page 1 of 1 |
| APPLICATION NO. | : 12/829251 | |
| DATED | : April 3, 2012 | |
| INVENTOR(S) | : R. Jacob Baker | |

It is certified that error appears in the above-identified patent and that said Letters Patent is hereby corrected as shown below:

In column 13, line 42, in Claim 3, delete "filer" and insert -- filter --, therefor.

In column 14, lines 14-15, in Claim 9, delete "analog-to digital" and insert -- analog-to-digital --, therefor.

Signed and Sealed this
Twenty-second Day of May, 2012

David J. Kappos
*Director of the United States Patent and Trademark Office*